United States Patent [19]

Newkirk et al.

[11] 4,005,990
[45] Feb. 1, 1977

[54] SUPERCONDUCTORS

[75] Inventors: Lawrence R. Newkirk, Los Alamos; Flavio A. Valencia, Santa Fe, both of N. Mex.

[73] Assignee: The United States of America as represented by the United States Energy Research and Development Administration, Washington, D.C.

[22] Filed: June 26, 1975

[21] Appl. No.: 590,747

[52] U.S. Cl. ............................. 29/196; 29/199; 29/599; 75/134 G; 75/174; 427/61; 427/62; 428/457

[51] Int. Cl.² ................... B23P 3/00; C23C 27/02

[58] Field of Search ............ 427/61, 62; 75/134 G, 75/174; 428/457; 29/599, 196, 199

[56] References Cited

UNITED STATES PATENTS

| 3,085,913 | 4/1963 | Caswell | 427/63 |
|---|---|---|---|
| 3,298,777 | 1/1967 | Brixner | 75/134 G |
| 3,506,940 | 4/1970 | Corenzwit et al. | 75/134 G |
| 3,630,769 | 12/1971 | Hart | 427/62 |
| 3,661,639 | 5/1972 | Caslaw | 427/62 |

OTHER PUBLICATIONS

Gaugler, *App. Phy. Lett.* vol. 23, No. 8 (Oct. 1973) "Superconductivity . . . NbGe Films . . . " pp. 480–482.

*Primary Examiner*—Michael F. Esposito
*Attorney, Agent, or Firm*—Dean E. Carlson

[57] ABSTRACT

The structural quality of niobium germanide as a high-transition-temperature superconducting material is substantially improved by the presence of about 5 at. % oxygen. Niobium germanide having this oxygen content may readily be prepared as a bulk coating bonded to a metallic substrate by chemical vapor deposition techniques.

12 Claims, 2 Drawing Figures

SUPERCONDUCTORS

BACKGROUND OF THE INVENTION

This invention relates to superconductors and more particularly to bulk coatings of niobium germanide ($Nb_3Ge$) superconducting compositions having transition temperatures of about 20 K and higher.

There are numerous applications for articles of manufacture comprising an appropriate superconducting coating bonded to a desired metallic substrate. Thus, for example, present concepts for a direct current superconducting power transmission line envisage the use of conductors in a dual capacity to contain the cryogenic coolant and also to carry the superconducting current. In this type of design, a layer of superconducting material surrounds a tube carrying liquid helium or possibly liquid hydrogen if an adequately high superconducting transition temperature can be achieved. The tube must be a good thermal and electrical conductor to provide stability to the superconducting coating. The coating, in turn, must have a high transition temperature ($T_c$) and critical current ($I_c$) and maintain good contact with the tube.

The art discloses that the superconducting material with the highest known transition temperature is niobium germanide ($Nb_3Ge$) having an A-15 structure. A transition temperature of 22.5 K has been measured using small sections of an extremely thin film ($< 0.1$ $\mu$m) of $Nb_3Ge$ deposited by sputtering under vacuum conditions. It is also known in the art that bulk coatings of $Nb_3Ge$ having transition temperatures in excess of 20 K may be deposited on suitable substrates by the coreduction of $NbCl_5$ and $GeCl_4$ in the presence of hydrogen.

The literature does not disclose niobium germanide superconducting compositions containing oxygen nor does it provide any teaching concerning what the effect of oxygen might be on the superconductivity of bulk coatings of niobium germanide. It has been generally believed, however, that the presence of even small amounts of oxygen in other superconductors having an A-15 structure, as, e.g., the very similar $Nb_3(Al,Ge)$, is highly detrimental.

SUMMARY OF THE INVENTION

The present invention encompasses as a composition of matter material of the general formula $Nb_3Ge$ containing about 1 to about 10 at. % oxygen. In a preferred embodiment, the material contains about 5 at. % oxygen. The invention also encompasses articles of manufacture comprising the compositions of matter of the invention bonded to a metallic substrate.

An oxygen content of about 5 at. % in the niobium germanide does not adversely affect the transition temperature, but does substantially improve the structural quality of the superconductor in that $\Delta T_c$, i.e., the temperature range over which 80 percent or more of the superconducting transition occurs, is greatly narrowed.

DESCRIPTION OF THE PREFERRED EMBODIMENTS

Figure 1:
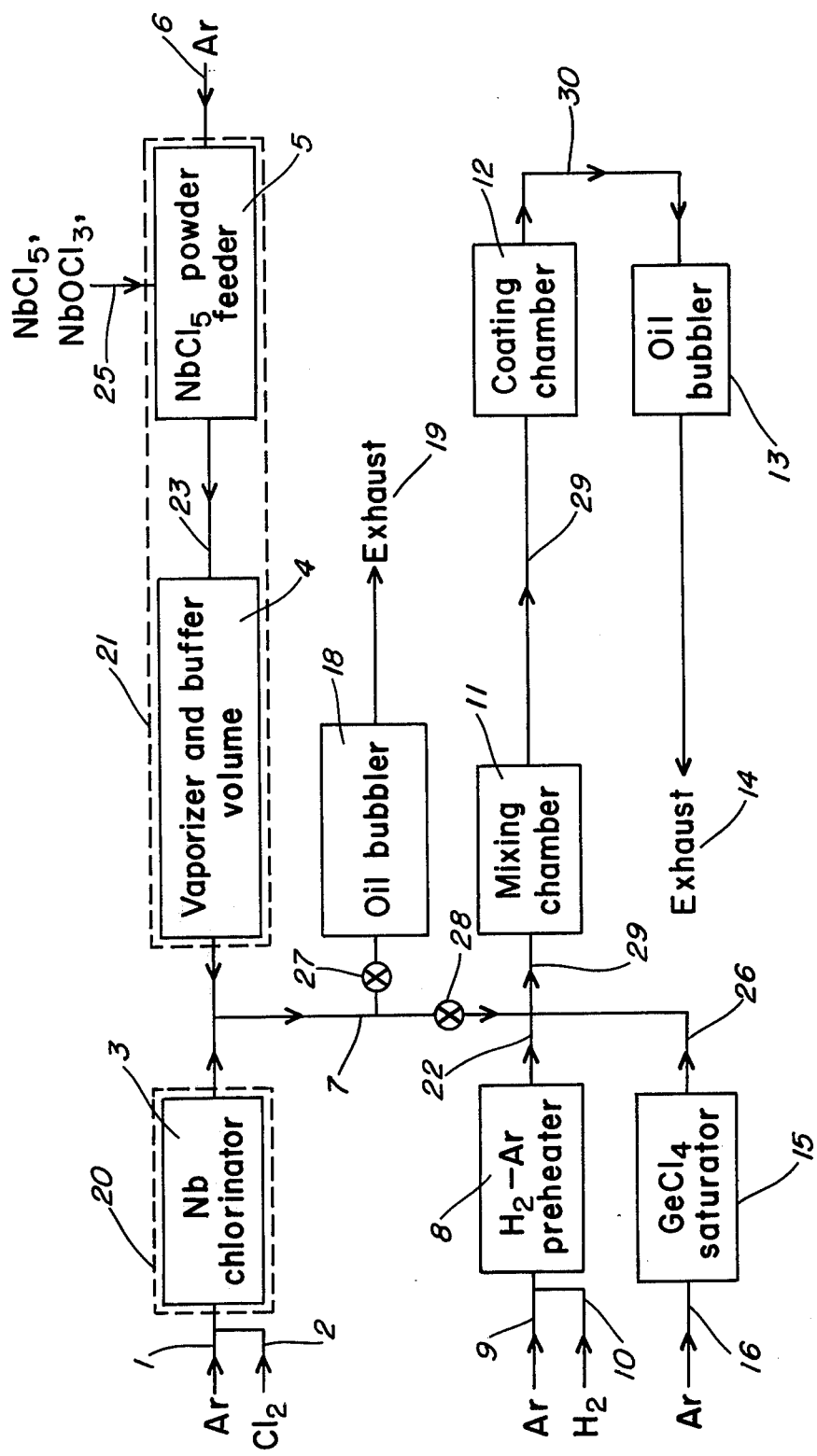
FIG. 1 is a flow chart of chemical vapor deposition processes by which the composition of matter of the invention may be made.

Niobium germanide ($Nb_3Ge$) containing a desired amount of oxygen is readily formed as a strongly adherent bulk coating bonded to a metallic substrate in accordance with the process shown in the flow chart and schematic of FIG. 1. The basis process consists of coreduction of $NbOCl_3$, $NbCl_5$, and $GeCl_4$ in appropriate molar ratio by hydrogen gas on a hot metallic substrate. As shown in FIG. 1, a mixture of $NbCl_5$ and $NbOCl_3$ vapor may be formed by either process 21 or process 20, although still other processes are possible and may be used. In process 21, an admixture 25 of a $NbCl_5$ and $NbOCl_3$ powder in a desired ratio is entrained in a flow of inert gas 6, preferably argon, by means of powder feeder 5. A powder feeder of the type sold under the tradename "Plasmatron" by Plasmadyne Division of Geotel Inc. is suitable for this purpose. Admixture 25 is screened to −100 mesh (U.S. screen) and feed rates varying from 0.8 to 2 g/min may readily be used with the Plasmatron. Rates are measured within an accuracy of about ± 5% by monitoring an electronic load cell 24 connected to the Plasmatron. The entrained powder than passes 23 into vaporizer 4 maintained at 400° C where the salt is vaporized. Vaporizer 4 has a 20 l volume which serves the additional function of smoothing fluctuations in the salt flow 23 caused by irregularities in feeder 5 or packing of the salt into small pellets.

Alternatively, in process 20, Nb chlorination is carried out using Nb chlorinator 3. An Ar flow 1 and $Cl_2$ flow 2 are mixed in a ratio of about 4:1 and passed through chlorinator 3 which contains Nb metal in the form of strips or cuttings maintained at 250°–260° C. Adding a desired small amount of $H_2O$ vapor to the $NbCl_5$ vapor produced by chlorination results in the desired admixture of $NbCl_5$ and $NbCl_3$ vapor.

The argon-salt vapor mixture 7 produced by either process 21 or process 20 is then either passed into the coating train or exhausted 19 through oil bubblers 18 depending on the position of valves 27 and 28.

An Ar flow 9 and $H_2$ flow 10 is mixed and passed through preheater 8 maintained at 500° C to form hot $H_2$-Ar mixture 22. At the same time, an Ar flow 16 is passed through liquid $GeCl_4$ in saturator 15 to form an Ar-$GeCl_4$ vapor mixture 26. In the coating train, mixtures 22, 7, and 26 are joined to form admixture 29 which passes through mixing chamber 11 maintained at 500° C. Chamber 11 contains a plurality of baffles to prevent any channeling of admixture 29 as it passes through. Admixture 29 then flows through coating chamber 12 where reduction takes place at 900° C according to the following reaction:

$$3NbCl_4 + GeCl_2 + 7H_2 \rightleftharpoons Nb_3Ge + 14HCl$$

The $NbCl_4$ and $GeCl_2$ which enter the reaction are generated from the $NbCl_5$ and $GeCl_4$ by thermal decomposition as the salt temperatures are increased through the coating train, with the excess chlorine reacting to form HCl. It is readily apparent that in the presence of $NbOCl_3$, the resultant $Nb_3Ge$ contains an amount of oxygen dependent on the amount of $NbOCl_3$ present in the admixture undergoing reduction. The resultant oxygen-containing $Nb_3Ge$ forms a coating on appropriate substrates place within chamber 12. The mixture 30 of unreacted vapor and product HCl exiting from chamber 12 is passed through oil bubblers 13 to prevent back diffusion of air and is then flowed to exhaust 14.

Niobium germanide coatings having an oxygen content ranging from less than 1 at. % to in excess of 10 at. % can readily be prepared by the method just described. They may be deposited on any suitable substrates but metallic substrates are preferred. A preferred metallic substrate is copper, but substrates such as, e.g., steel, stainless steel, hastalloy, inconel, or nickel are also appropriate. Useful substrates are those which retain their integrity during the coating process, i.e., they do not melt or hydride. Preferred substrates are also those capable of forming a diffusion bond with the oxygen-containing niobium germanide.

Figure 2:
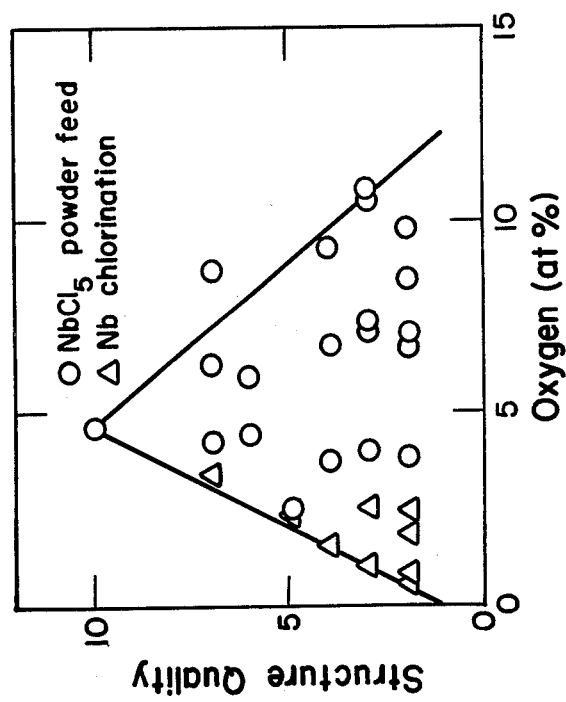
FIG. 2 shows the effect of oxygen content on the structural quality of niobium germanide.

FIG. 2 shows the effect of oxygen content on the structural quality of niobium germanide. The quality factors used as the ordinate of FIG. 1 are based on the fact that $Nb_3Ge$ with a high transition temperature has the x-ray pattern (Cu radiation) with approximately the angles given in the table. The quality rating system is based on how many lines are resolved into $a_1$ and $a_2$ doublets. The lower the angle at which resolution takes place, the sharper are the x-ray lines and the more homogeneous or uniform is the structure.

It is apparent from FIG. 2 that a preferred oxygen content is about 5 at. % and either an increase or decrease in the oxygen content from this region degrades the quality of the superconductor. As the oxygen content varies substantially from this region the lattice spacings and superconducting onsets are not changed a great deal (<0.005A and <1K) but the high angle lines lose their resolution and the transition temperature $T_c$ loses its sharpness. That is to say, $\Delta T_c$, i.e., the temperature range over which 80 percent or more of the superconducting transition occurs, becomes broad. For many superconducting applications, a broad $\Delta T_c$ is undesirable.

Table

| Reflection (HKL) | 2θ (degrees) | Quality Factor |
|---|---|---|
| 200 | 35.0 | |
| 210 | 39.3 | |
| 211 | 43.2 | |
| 222 | ~ 62.5 | |
| 320 | ~ 65.5 | |
| 321 | ~ 68.5 | 10 |
| 400 | 73.7 | |
| 420 | ~ 84 | 9 |
| 421 | ~ 86 | |
| 332 | ~ 88 | 8 |
| 520 | 107.5 | 7 |
| 521 | 110.3 | |
| 440 | ~ 115 | 6 |
| 600 | ~ 128 | 5 |
| 610 | 131.4 | |
| 611 | 134.8 | 4 |
| No resolution but fair lines | | 3 |
| No resolution and poor lines | | 2 |
| No resolution and diffuse lines | | 1 |

What we claim is:

1. The composition of matter which comprises material of the general formula $Nb_3Ge$ containing about 1 to about 10 at. % oxygen.

2. The composition of claim 1 wherein said oxygen content is about 5 at. %.

3. The composition of claim 1 wherein said oxygen-containing $Nb_3Ge$ is $Nb_3(Ge_{1-x}O_x)$ where $x$ is in the range of about 0.04 to about 0.4.

4. The composition of claim 3 wherein $x$ is about 0.2.

5. The composition of claim 1 wherein said oxygen-containing $Nb_3Ge$ is $(Nb_3Ge)_{1-x}(NbO)_x$ where $x$ is in the range of about 0.02 to about 0.2.

6. The composition of claim 5 wherein $x$ is about 0.1.

7. The article of manufacture which comprises material of the general formula $Nb_3Ge$ containing about 1 to about 10 at. % oxygen bonded to a metallic substrate.

8. The article of manufacture of claim 7 wherein said oxygen content is about 5 at. %.

9. The article of manufacture of claim 8 in which said metallic substrate is copper, steel, or stainless steel.

10. The article of manufacture of claim 9 wherein said metallic substrate is copper.

11. The article of manufacture of claim 8 wherein said oxygen-containing $Nb_3Ge$ has the A-15 structure and a transition temperature in excess of 20 K.

12. The article of manufacture of claim 11 wherein said oxygen-containing $Nb_3Ge$ is diffusion bonded to a copper substrate.

* * * * *